(12) United States Patent
Zhang

(10) Patent No.: US 10,075,169 B2
(45) Date of Patent: Sep. 11, 2018

(54) CONFIGURABLE COMPUTING ARRAY BASED ON THREE-DIMENSIONAL VERTICAL WRITABLE MEMORY

(71) Applicant: ChengDu HaiCun IP Technology LLC, ChengDu (CN)

(72) Inventor: Guobiao Zhang, Corvallis, OR (US)

(73) Assignees: ChengDu HaiCun IP Technology LLC, ChengDu, SiChuan (CN); Guobiao Zhang, Corvallis, OR (US)

( * ) Notice: Subject to any disclaimer, the term of this patent is extended or adjusted under 35 U.S.C. 154(b) by 0 days.

(21) Appl. No.: 15/793,927

(22) Filed: Oct. 25, 2017

(65) Prior Publication Data

US 2018/0048315 A1    Feb. 15, 2018

Related U.S. Application Data

(63) Continuation-in-part of application No. 15/450,049, filed on Mar. 6, 2017, now Pat. No. 9,838,021, which
(Continued)

(30) Foreign Application Priority Data

| Mar. 5, 2016 | (CN) | 2016 1 0125227 |
| May 10, 2016 | (CN) | 2016 1 0307102 |
| Oct. 20, 2017 | (CN) | 2017 1 0980779 |
| Oct. 20, 2017 | (CN) | 2017 1 0980813 |
| Oct. 20, 2017 | (CN) | 2017 1 0980826 |

(51) Int. Cl.
    *H03K 19/173* (2006.01)
    *H03K 19/177* (2006.01)
(Continued)

(52) U.S. Cl.
    CPC .......... *H03K 19/1776* (2013.01); *G11C 5/02* (2013.01); *G11C 29/028* (2013.01);
(Continued)

(58) Field of Classification Search
    CPC ......... H03K 19/1776; H03K 19/17728; G11C 5/02; H01L 27/1052
(Continued)

(56) References Cited

U.S. PATENT DOCUMENTS

| 4,870,302 A | 9/1989 | Freeman |
| 5,046,038 A | 9/1991 | Briggs et al. |

(Continued)

OTHER PUBLICATIONS

Paul et al., "Reconfigurable Computing Using Content Addressable Memory for Improved Performance and Resource Usage", Design Automation Conference (DAC), pp. 786-791, 2008.
(Continued)

*Primary Examiner* — Don Le

(57) ABSTRACT

The present invention discloses a configurable computing array. It is a monolithic integrated circuit comprising at least a configurable computing element and a configurable logic element. The configurable computing element comprises at least a three-dimensional vertical writable memory (3D-$W_V$) array, which is stacked above the configurable logic element and stores at least a portion of a look-up table (LUT) for a math function.

20 Claims, 7 Drawing Sheets

Related U.S. Application Data is a continuation-in-part of application No. 15/450,017, filed on Mar. 5, 2017, now Pat. No. 9,948,306.

(51) Int. Cl.
  *G11C 5/02* (2006.01)
  *H01L 27/105* (2006.01)
  *G11C 29/02* (2006.01)

(52) U.S. Cl.
  CPC ..... *H01L 27/1052* (2013.01); *H03K 19/1737* (2013.01); *H03K 19/17728* (2013.01); *H03K 19/17744* (2013.01)

(58) Field of Classification Search
  USPC .......................................................... 326/38
  See application file for complete search history.

(56) References Cited

U.S. PATENT DOCUMENTS

| | | | |
|---|---|---|---|
| 5,835,396 A | 11/1998 | Zhang | |
| 5,954,787 A | 9/1999 | Eun | |
| 6,194,912 B1* | 2/2001 | Or-Bach | H03K 19/17736 326/38 |
| 7,285,981 B2* | 10/2007 | Madurawe | H03K 19/177 326/38 |
| 7,472,149 B2 | 12/2008 | Endo | |
| 7,512,647 B2 | 3/2009 | Wilson et al. | |
| 8,564,070 B2 | 10/2013 | Zhang | |
| 9,207,910 B2 | 12/2015 | Azadet et al. | |
| 9,225,501 B2 | 12/2015 | Azadet | |
| 9,787,327 B2* | 10/2017 | Zhang | H03M 13/1545 |
| 2009/0190404 A1* | 7/2009 | Roohparvar | G11C 15/046 365/185.17 |

OTHER PUBLICATIONS

Karam et al, "Emerging Trends in Design and Applications of Memory-Based Computing and Content-Addressable Memories", Proceedings of the IEEE, vol. 103, issue 8, pp. 1311-1330, 2015.

"7 Series FPGAs Configurable Logic Block User Guide", Xilinx, Sep. 27, 2016, p. 21 https://www.xilinx.com/support/documentation/user_guides/ug474_7Series_CLB.pdf.

Harrison, et al., "The Computation of Transcendental Functions on the IA-64 Architecture", Intel Technology Journal, Q4, 1999, p. 6 https://www.intel.com/content/dam/www/public/us/en/documents/research/1999-vol03-iss-4-intel-technology-journal.pdf.

* cited by examiner $C = A, \overline{A}$, A shift by n bits, AND(A,B), OR(A,B), NAND(A,B), NOR(A,B), XOR(A,B), A+B, or A-B ...

CONFIGURABLE COMPUTING ARRAY BASED ON THREE-DIMENSIONAL VERTICAL WRITABLE MEMORY

CROSS-REFERENCE TO RELATED APPLICATIONS

This application is a continuation-in-part of U.S. patent application Ser. No. 15/450,049, filed Mar. 6, 2017, which is a continuation-in-part of U.S. patent application Ser. No. 15/450,017, filed Mar. 5, 2017. These patent applications claim priorities from Chinese Patent Application No. 201610125227.8, filed Mar. 5, 2016; Chinese Patent Application No. 201610307102.7, filed May 10, 2016, in the State Intellectual Property Office of the People's Republic of China (CN).

This application also claims priorities from Chinese Patent Application No. 201710980779.1, filed Oct. 20, 2016; Chinese Patent Application No. 201710980813.5, filed Oct. 20, 2016; Chinese Patent Application No. 201710980826.2, filed Oct. 20, 2016, in the State Intellectual Property Office of the People's Republic of China (CN), the disclosure of which are incorporated herein by reference in their entireties.

BACKGROUND

1. Technical Field of the Invention

The present invention relates to the field of integrated circuit, and more particularly to configurable gate array.

2. Prior Art

A configurable gate array is a semi-custom integrated circuit designed to be configured by a customer after manufacturing. U.S. Pat. No. 4,870,302 issued to Freeman on Sep. 26, 1989 (hereinafter referred to as Freeman) discloses a configurable gate array. It contains an array of configurable logic elements (also known as configurable logic blocks) and a hierarchy of configurable interconnects (also known as programmable interconnects) that allow the configurable logic elements to be wired together. Each configurable logic element in the array is in itself capable of realizing any one of a plurality of logic functions (e.g. shift, logic NOT, logic AND, logic OR, logic NOR, logic NAND, logic XOR, arithmetic addition "+", arithmetic subtraction "−", etc.) depending upon a first configuration signal. Each configurable interconnect can selectively couple or de-couple interconnect lines depending upon a second configuration signal.

Complex math functions are widely used in various applications. A complex math function has multiple independent variables and can be expressed as a combination of basic math functions. On the other hand, a basic function has a single or few independent variables. Exemplary basic functions include transcendental functions, such as exponential function (exp), logarithmic function (log), trigonometric functions (sin, cos, tan, atan) and others. To meet the speed requirements, many high-performance applications require that these complex math functions be implemented in hardware. In conventional configurable gate arrays, complex math functions are implemented in fixed computing elements, which are portions of hard blocks and not configurable, i.e. the circuits implementing these complex math functions are fixedly connected and are not subject to change by programming. Apparently, fixed computing elements would limit further applications of the configurable gate array. To overcome this difficulty, the present invention expands the original concept of the configurable gate array by making the fixed computing elements configurable. In other words, besides configurable logic elements, the configurable gate array comprises configurable computing elements, which can realize any one of a plurality of math functions.

Objects and Advantages

It is a principle object of the present invention to extend the applications of a configurable gate array to the field of complex math computation.

It is a further object of the present invention to provide a configurable computing array where not only logic functions can be customized, but also math functions.

It is a further object of the present invention to provide a configurable computing array with a small size.

It is a further object of the present invention to provide a configurable computing array that can realize a large number of functions.

In accordance with these and other objects of the present invention, the present invention discloses a configurable computing array based on three-dimensional vertical writable memory (3D-$W_V$).

SUMMARY OF THE INVENTION

The present invention discloses a configurable computing array based on three-dimensional vertical writable memory (3D-$W_V$). It is a monolithic integrated circuit comprising an array of configurable computing elements, an array of configurable logic elements and an array of configurable interconnects. Each configurable computing element comprises at least a 3D-$W_V$ array, which is electrically programmable and can be loaded with a look-up table (LUT) for a math function. The 3D-$W_V$ could be based on vertical transistors or vertical diodes. Being electrically programmable and having the largest storage density of all semiconductor memories, the math functions that can be realized by a 3D-$W_V$ array are essentially boundless and numerous.

The usage cycle of the configurable computing element comprises two stages: a configuration stage and a computation stage. In the configuration stage, the LUT for a desired math function is loaded into the 3D-$W_V$ array. In the computation stage, a selected portion of the LUT for the desired math function is read out from the 3D-$W_V$ array. When the 3D-$W_V$ array is rewritable, a configurable computing element can be re-configured to realize different math functions at different time.

Besides configurable computing elements, the preferred configurable computing array further comprises configurable logic elements and configurable interconnects. During operation, a complex math function is first decomposed into a combination of basic math functions. Each basic math function is realized by programming the associated configurable computing element. The complex math function is then realized by programming the appropriate configurable logic elements and configurable interconnects.

Accordingly, the present invention discloses a configurable computing array, comprising: a semiconductor substrate; at least a configurable logic element formed on said semiconductor substrate, wherein said configurable logic element selectively realizes a logic function from a logic library; at least a configurable computing element formed above said configurable logic element, wherein said configurable computing element comprises a three-dimensional vertical writable memory (3D-$W_V$) array for storing at least a portion of a look-up table (LUT) for a math function; wherein said configurable computing array realizes a math function by programming said configurable logic element and said configurable computing element.

The present invention further discloses another configurable computing array, comprising: a semiconductor substrate; at least a configurable interconnect formed on said semiconductor substrate, wherein said configurable interconnect selectively realizes an interconnect from an interconnect library; at least a configurable computing element formed above said configurable interconnect, wherein said configurable computing element comprises a three-dimensional vertical writable memory (3D-$W_V$) array for storing at least a portion of a look-up table (LUT) for a math function; wherein said configurable computing array realizes a math function by programming said configurable interconnect and said configurable computing element.

The present invention further discloses yet another configurable computing array, comprising: a semiconductor substrate; at least a configurable interconnect formed on said semiconductor substrate, wherein said configurable interconnect selectively realizes an interconnect from an interconnect library; at least a configurable logic element formed on said semiconductor substrate, wherein said configurable logic element selectively realizes a logic function from a logic library; at least a configurable computing element formed above said configurable interconnect, wherein said configurable computing element comprises a three-dimensional vertical writable memory (3D-$W_V$) array for storing at least a portion of a look-up table (LUT) for a math function; wherein said configurable computing array realizes a math function by programming said configurable interconnect, said configurable logic element and said configurable computing element.

Figure 1:
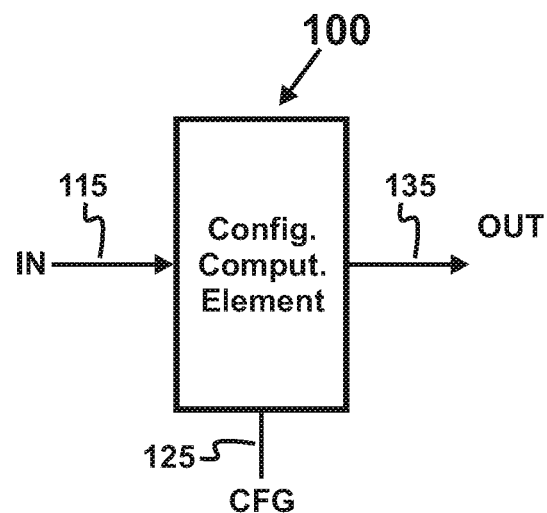
FIG. 1 discloses a symbol for a preferred configurable computing element.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. In the present invention, the terms "write", "program" and "configure" are used interchangeably. The phrase "a circuit is formed on a substrate" means that the active elements (e.g. diodes/transistors) of the circuit are formed on the substrate, i.e. at least a portion of the active element (e.g. channel/source/drain) is formed in the substrate. The phrase "a circuit is formed above a substrate" means that the active elements (e.g. diodes/transistors) of the circuit are formed above the substrate, i.e. no portion of the active element is formed in the substrate. The symbol "/" means a relationship of "and" or "or".

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Referring now to FIG. 1, a symbol for a preferred configurable computing element 100 is shown. The input port IN includes input data 115, the output port OUT includes output data 135, and the configuration port CFG includes at least a configuration signal 125. When the configuration signal 125 is "write", the look-up table (LUT) for a desired math function is loaded into the configurable computing element 100; when the configuration signal 125 is "read", the functional/derivative/other value of the desired math function is read out from the LUT.

Figure 2:
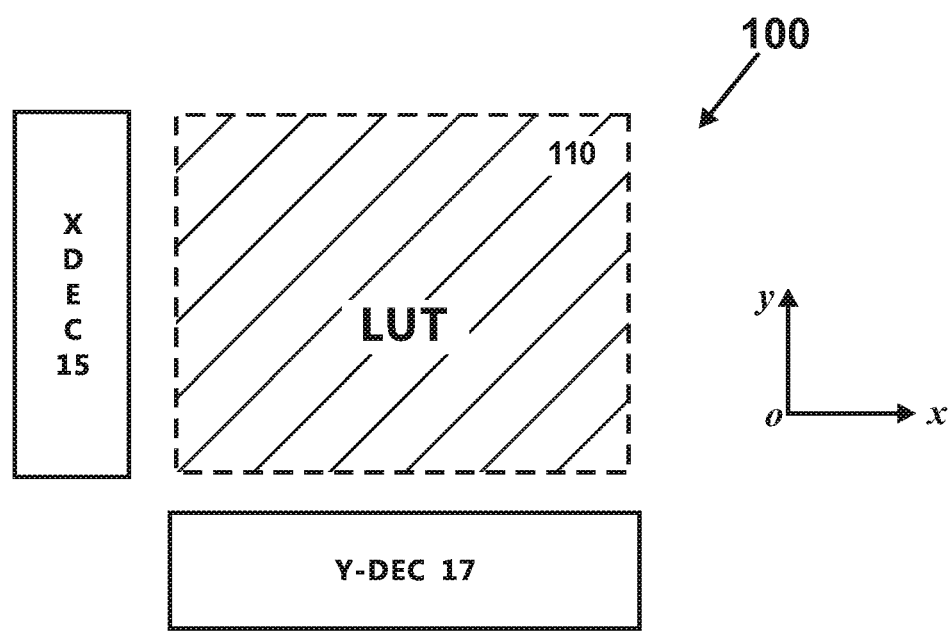
FIG. 2 is a layout view of the preferred configurable computing element.

FIG. 2 is a layout view of the preferred configurable computing element 100. The LUT is stored in at least a writable-memory array 110. The configurable computing element 100 further includes the X decoder 15 and Y decoder (including read-out circuit) 17 of the writable-memory array 110. The writable-memory array 110 could be a RAM array or a ROM array. Exemplary RAM includes SRAM, DRAM, etc. On the other hand, exemplary ROM includes OTP (one-time-programmable) and MTP (multiple-time-programmable, including re-programmable), etc. Among them, the MTP further includes EPROM, EEPROM, flash memory, three-dimensional memory, etc.

Figure 3:
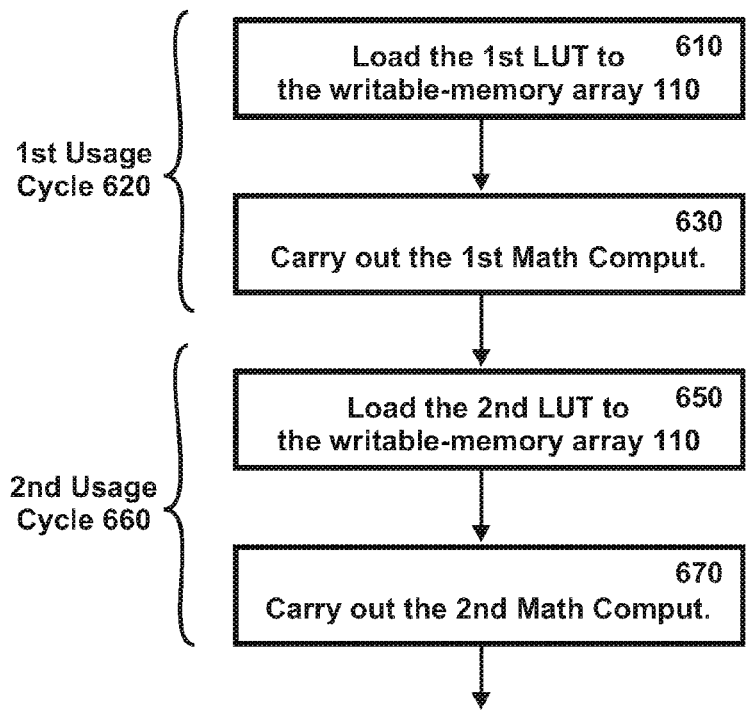
FIG. 3 discloses two usage cycles of a preferred re-configurable computing element.

Referring now to FIG. 3, two usage cycles 620, 660 of a preferred re-configurable computing element 100 are shown. For the re-configurable computing element 100, the writable-memory array 110 is re-programmable. The first usage cycle 620 includes two stages: a configuration stage 610 and a computation stage 630. In the configuration stage 610, the LUT for a first desired math function is loaded into the writable-memory array 110. In the computation stage 630, a selected portion of the LUT for the first desired math function is read out from the writable-memory array 110. Being re-programmable, the re-configurable computing element 100 can realize different math functions during different usage cycles 620, 660. During the second usage cycle 660 (including two stages 650, 670), the LUT for a second desired math function is loaded and later read out. The re-configurable computing element 100 is particularly suitable for single-instruction-multiple-data (SIMD)-type of data processing. Once the LUTs are loaded into the writable-memory arrays 110 in the configuration stage, a large amount of data can be fed into the re-configurable computing element 100 and processed at high speed. SIMD has many applications, e.g. vector processing in image processing, massively parallel processing in scientific computing.

Figure 4A:
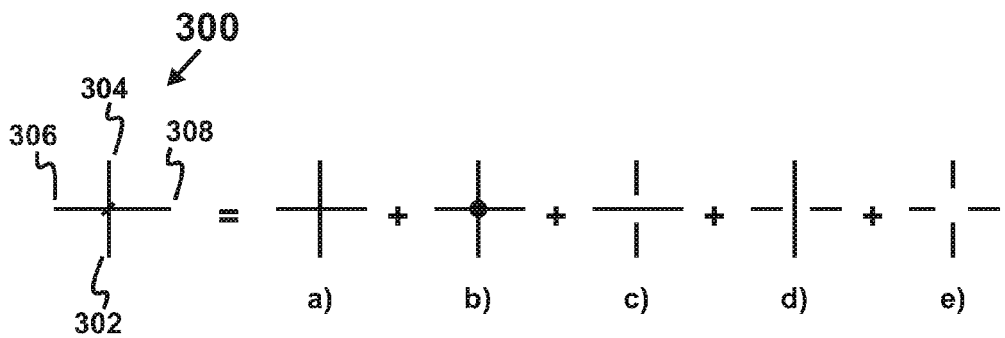
FIG. 4A shows an interconnect library supported by a preferred configurable interconnect.
Figure 4B:
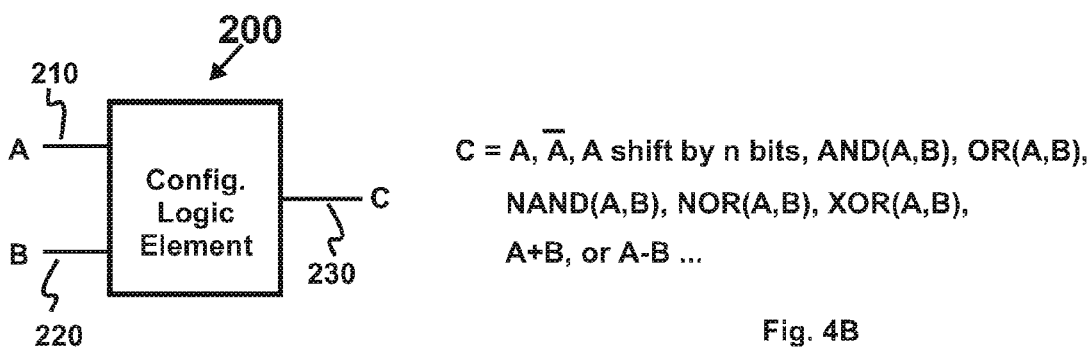
FIG. 4B shows a logic library supported by a preferred configurable logic element.

Referring now to FIGS. 4A-4B, an interconnect library and a logic library are shown. FIG. 4A shows the interconnect library supported by a preferred configurable interconnect 300. An interconnect library is a collection of all interconnects supported by a configurable interconnect. This interconnect library includes the followings: a) the interconnects 302/304 are coupled, the interconnects 306/308 are coupled, but 302/304 are not connected with 306/308; b) the interconnects 302/304/306/308 are all coupled; c) the interconnects 306/308 are coupled, but the interconnects 302, 304 are not coupled, neither are 302, 304 connected with 306/308; d) the interconnects 302/304 are coupled, but the interconnects 306, 308 are not coupled, neither are 306, 308 connected with 302/304; e) interconnects 302, 304, 306, 308 are not coupled at all. As used herein, the symbol "/" between two interconnects means that these two interconnects are coupled, while the symbol "," between two interconnects means that these two interconnects are not coupled. More details on the configurable interconnects are disclosed in Freeman.

FIG. 4B shows the logic library supported by a preferred configurable logic element 200. A logic library is a collection of all logic functions supported by a configurable logic element. In this preferred embodiment, the inputs A and B include input data 210, 200, and the output C includes the output data 230. The logic library includes the following logic functions: C=A, NOT A, A shift by n bits, AND(A,B), OR(A,B), NAND(A,B), NOR(A,B), XOR(A,B), A+B, A−B. To facilitate pipelining, the configurable logic element 200 may comprise sequential logic such as flip-flops and registers. More details on the configurable logic elements are disclosed in Freeman.

Figure 5:
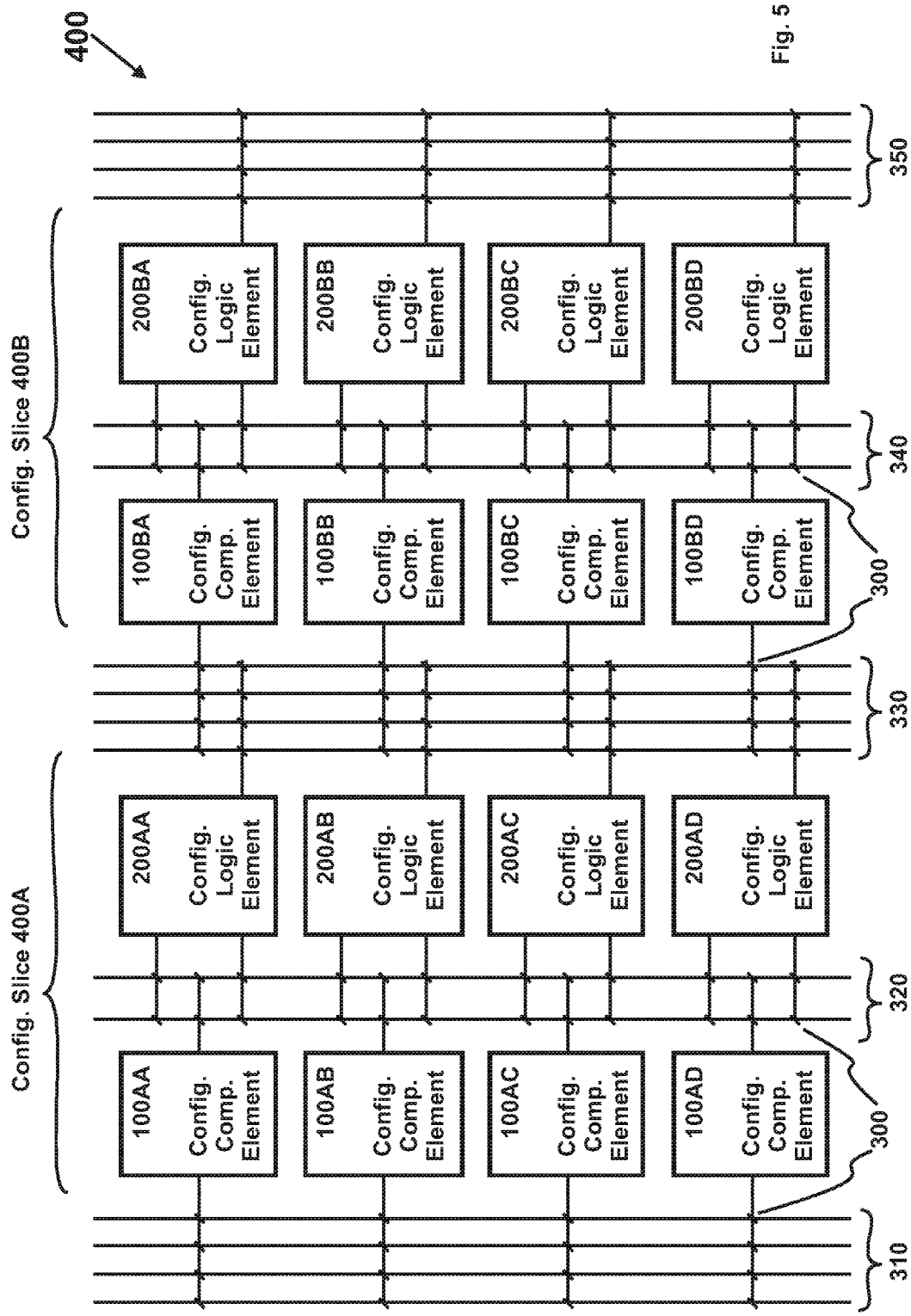
FIG. 5 is a circuit block diagram of a first preferred configurable computing array.

Referring now to FIG. 5, a first preferred configurable computing array 400 is disclosed. It comprises first and second configurable slices 400A, 400B. Each configurable slice (e.g. 400A) comprises a first array of configurable computing elements (e.g. 100AA-100AD) and a second array of configurable logic elements (e.g. 200AA-200AD). A configurable channel 320 is placed between the first array of configurable computing elements (e.g. 100AA-100AD) and the second array of configurable logic elements (e.g. 200AA-200AD). The configurable channels 310, 330, 350 are also placed between different configurable slices 300A, 300B. The configurable channels 310-350 comprise an array of configurable interconnects 300. For those skilled in the art, besides configurable channels, sea-of-gates may also be used.

Figure 6:
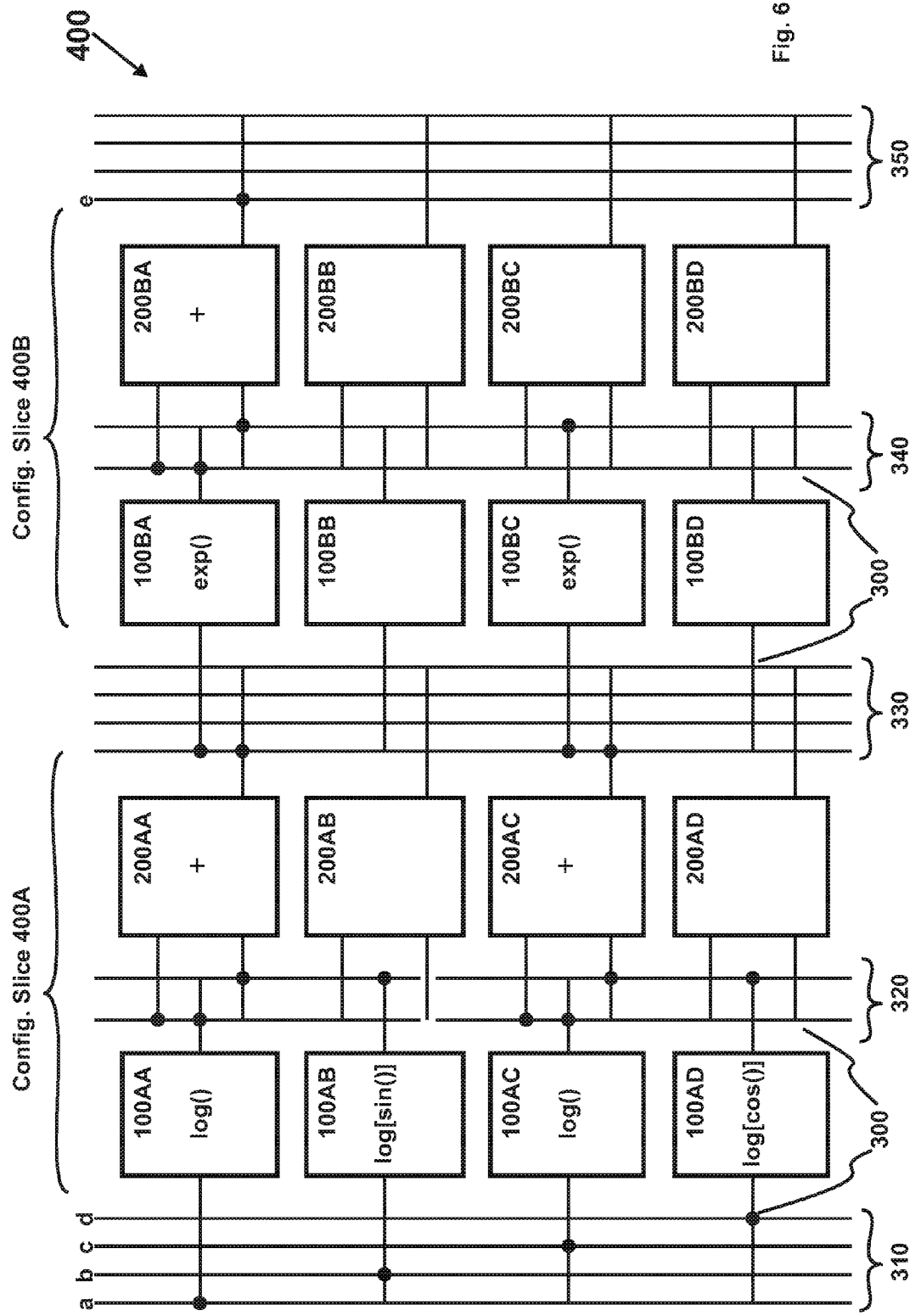
FIG. 6 shows an instantiation of the first preferred configurable computing array implementing a complex math function.

FIG. 6 discloses an instantiation of the first preferred configurable computing array implementing a complex math function e=a·sin(b)+c·cos(d). The configurable interconnects 300 in the configurable channel 310-350 use the same convention as FIG. 4A: the interconnects with dots mean that the interconnects are connected; the interconnects without dots mean that the interconnects are not connected; a broken interconnect means that two broken sections are disconnected. In this preferred implementation, the configurable computing element 100AA is configured to realize the function log( ), whose result log(a) is sent to a first input of the configurable logic element 200A. The configurable computing element 100AB is configured to realize the function log [sin( )], whose result log [sin(b)] is sent to a second input of the configurable logic element 200A. The configurable logic element 200A is configured to realize arithmetic addition "+", whose result log(a)+log [sin(b)] is sent the configurable computing element 100BA. The configurable computing element 100BA is configured to realize the function exp( ), whose result exp{log(a)+log [sin(b)]}=a·sin(b) is sent to a first input of the configurable logic element 200BA. Similarly, through proper configurations, the results of the configurable computing elements 100AC, 100AD, the configurable logic elements 200AC, and the configurable computing element 100BC can be sent to a second input of the configurable logic element 200BA. The configurable logic element 200 BA is configured to realize arithmetic addition "+", whose result a·sin(b)+c·cos(d) is sent to the output e. Apparently, by changing its configuration, the configurable computing array 400 can realize other complex math functions.

Figure 7:
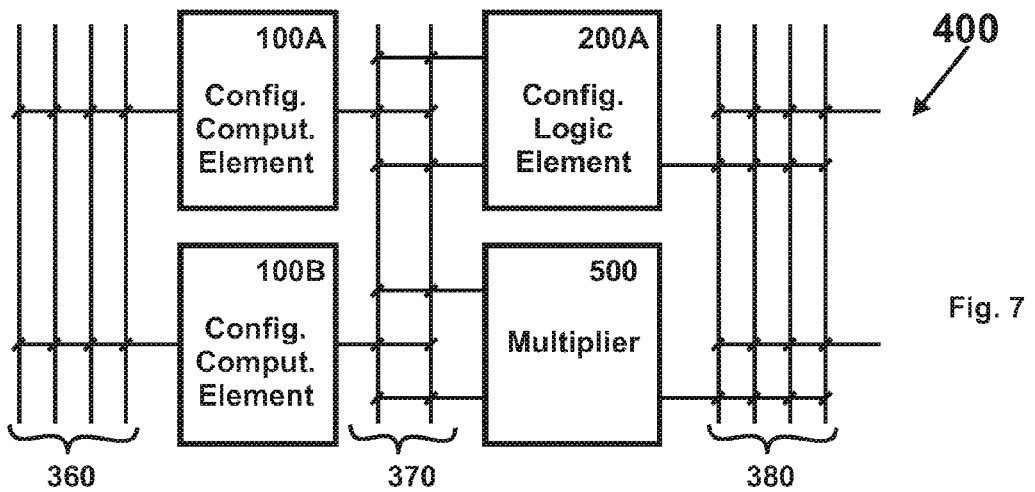
FIG. 7 is a circuit block diagram of a second preferred configurable computing array.

Referring now to FIG. 7, a second preferred configurable computing array 400 is shown. Besides configurable computing elements 100A, 100B and configurable logic element 200A, this preferred embodiment further comprises a multiplier 500. The configurable channels 360-380 comprise a plurality of configurable interconnects. With the addition of the multiplier 500, the preferred configurable computing array 400 can realize more math functions and its computational power will become more powerful.

Figure 8A:
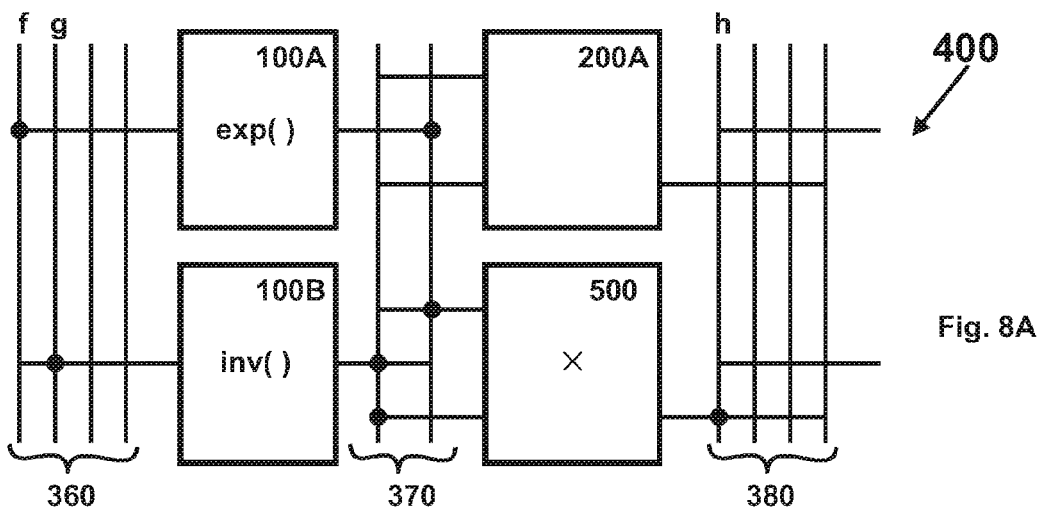
FIGS. 8A-8B show two instantiations of the second preferred configurable computing array.
Figure 8B:
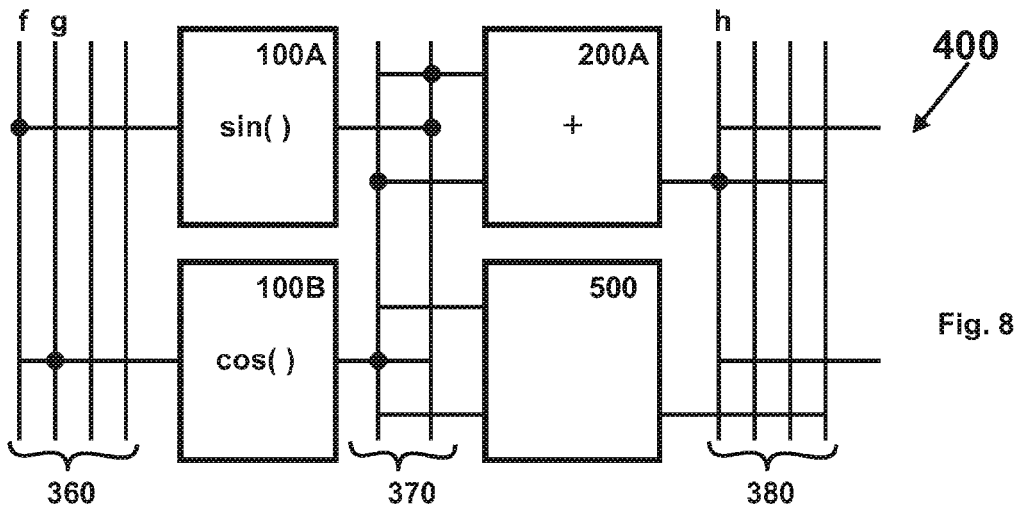

FIGS. 8A-8B disclose two instantiations of the second preferred configurable computing array 400. In the instantiation of FIG. 8A, the configurable computing element 100A is configured to realize the function exp(f), while the configurable computing element 100B is configured to realize the function inv(g). The configurable channel 370 is configured in such a way that the outputs of 100A, 100B are fed into the multiplier 500. The final output is then h=exp(f)*inv(g). On the other hand, in the instantiation of FIG. 8B, the configurable computing element 100A is configured to realize the function sin(f), while the configurable computing element 100B is configured to realize the function cos(g). The configurable channel 370 is configured in such a way that the outputs of 100A, 100B are fed into the configurable logic element 200A, which is configured to realize arithmetic addition. The final output is then h=sin(f)+cos(g).

Figure 9A:
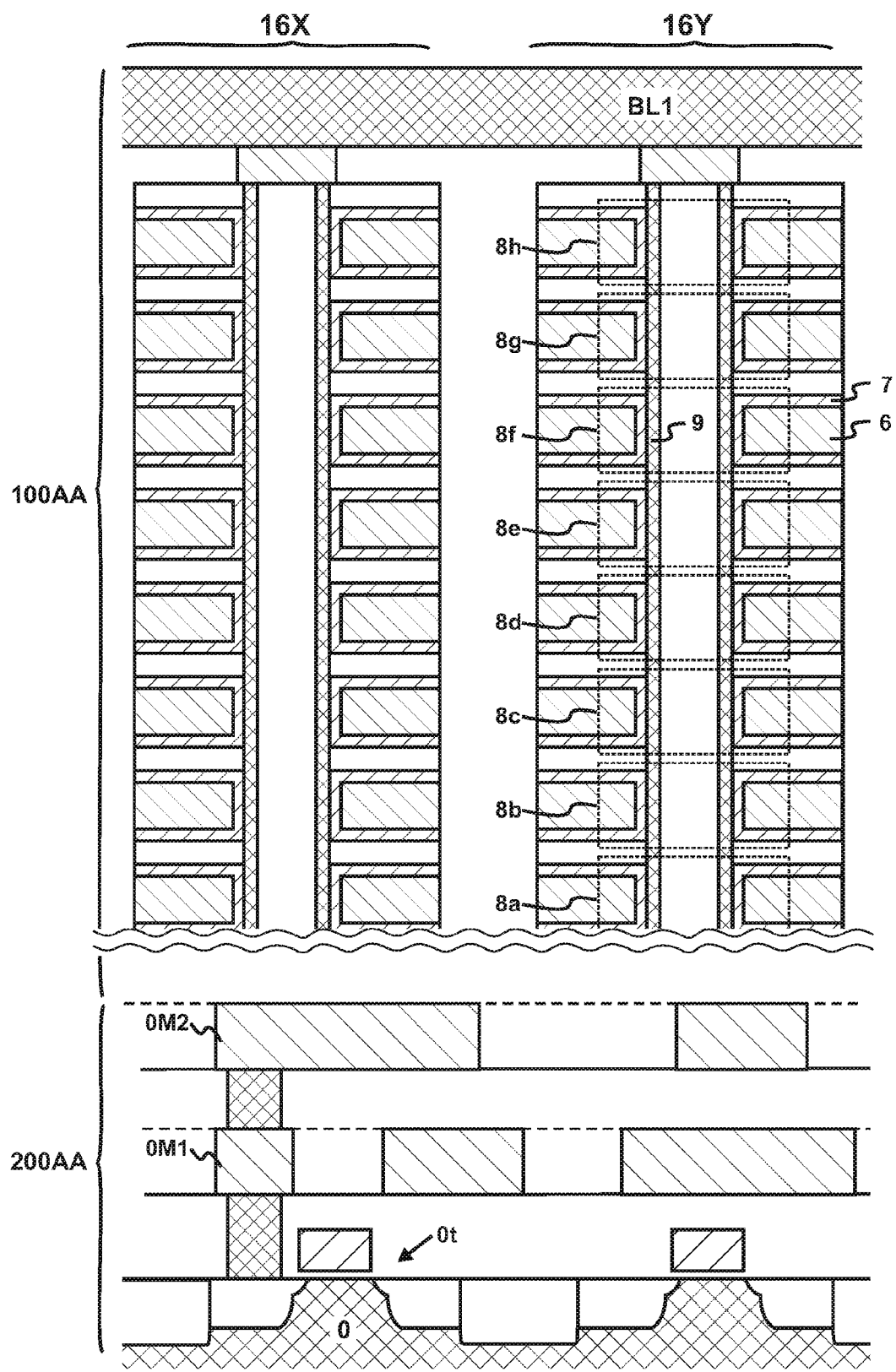
FIGS. 9A-9B are cross-sectional views of two preferred configurable computing-array dice based on three-dimensional vertical writable memory (3D-$W_V$).
Figure 9B:
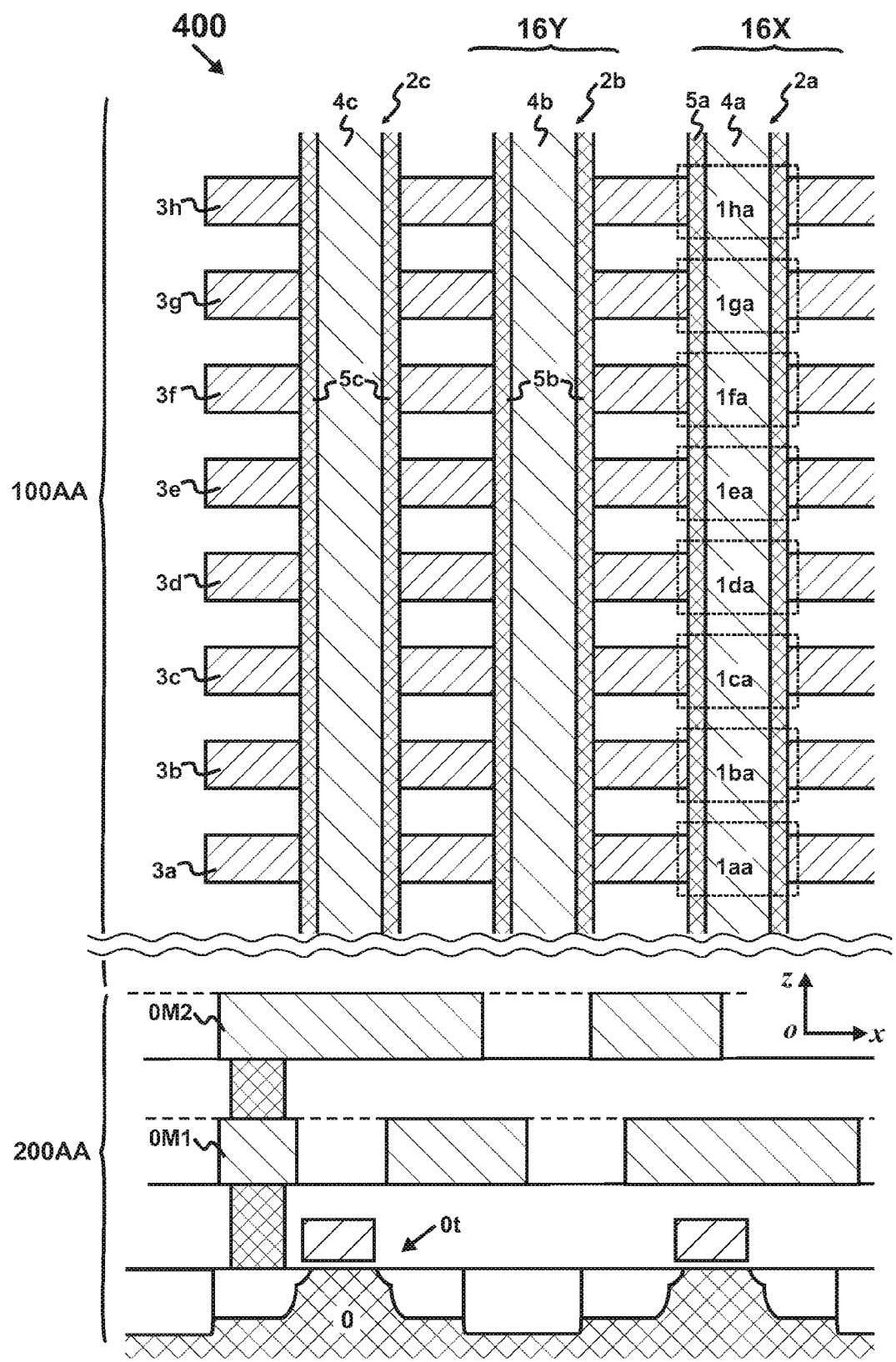

Referring now to FIGS. 9A-9B, two preferred configurable computing-array dice 400 based on 3D-$W_V$ are disclosed. It is a monolithic integrated circuit comprising a configurable computing element 100AA and a configurable logic element 200AA. The configurable logic element 200AA is formed on a semiconductor substrate, while the configurable computing element 100A is stacked on/above the configurable logic element 200A. The configurable computing element 100AA and the configurable logic element 200AA are coupled through a plurality of contact vias (not shown on these figures). The configurable computing element 100AA comprises at least a 3D-$W_V$ array. Within the 3D-$W_V$ array, at least one set of the address lines are oriented in a direction perpendicular to the surface of the substrate. Because the 3D-$W_V$ has the largest storage density among of semiconductor memories, it can store the LUTs for a large number of functions and/or the LUTs with a high precision.

The preferred 3D-$W_V$ array in FIG. 9A is based on vertical transistors or transistor-like devices. In this preferred embodiment, the 3D-$M_V$ array (e.g. 3D-NAND array) comprises a plurality of vertical memory strings 16X, 16Y placed side-by-side. Each memory string (e.g. 16X) comprises a plurality of vertically stacked memory cells (e.g. 8a-8h). These memory cells are coupled through a vertical address line 18. Each memory cell (e.g. 8f) comprises a vertical transistor, which includes a gate 6, a storage layer 7 and a vertical channel 9. The configurable logic element 200AA comprises horizontal transistors 0t and interconnects 0M1, 0M2. The transistors 0t are formed on the substrate 0 and they are conventional transistors. The 3D-$W_V$ array is coupled with the transistors 0t and interconnects 0M1, 0M2 through a plurality of contact vias (not shown on this figure). It should be noted that the transistors 0t and interconnects 0M1, 0M2 can form not only configurable logic elements 200AA, but also configurable interconnects (not shown on this figure).

The preferred 3D-W$_V$ array in FIG. 9B is based on vertical diodes or diode-like devices. Similar to FIG. 9A, the 3D-M$_V$ array comprises a plurality of vertical memory strings 16X, 16Y placed side-by-side. Each memory string (e.g. 16X) comprises a plurality of vertically stacked memory cells (e.g. 1aa-1ha). The 3D-M$_V$ array comprises a plurality of horizontal address lines (word lines) 3a-3h which are vertically stacked above each other. After etching through the horizontal address lines 3a-3h to form a plurality of vertical memory wells 2a-2d, the sidewalls of the memory wells 2a-2d are covered with a programmable layer 5a-5c. In another embodiment, the sidewalls are further covered with a diode layer (not shown in this figure). The memory wells 2a-2d are then filled with a conductive materials to form vertical address lines (bit lines) 4a-4d. The conductive materials could comprise metallic materials or doped semiconductor materials. The memory cells 1aa-1ha are formed at the intersections of the word lines 3a-3h and the bit line 4a. The programmable layer 5a could be one-time-programmable (OTP, e.g. an antifuse layer) or multiple-time-programmable (MPT, e.g. a resistive RAM layer). The programmable layer 5a could have an electrical characteristic like a diode per se. Alternatively, an extra diode layer is formed to minimize the interference between memory cells. It should be noted that the transistors 0t and interconnects 0M1, 0M2 can form not only configurable logic elements 200AA, but also configurable interconnects (not shown on this figure).

The preferred configurable computing arrays shown in the figures are field-programmable computing array (FPCA). For an FPCA, all manufacturing processes are finished in factory. The function of the FPCA can be electrically defined in the field of use. The concept of FPCA can be extended to mask-programmed computing array (MPCA). For a MPCA, wafers containing the configurable computing elements and the configurable logic elements are prefabricated and stockpiled in factory. However, certain interconnects on these wafers are not fabricated until the function of the MPCA is finally defined.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A configurable computing array, comprising:
   a semiconductor substrate;
   at least a configurable logic element formed on said semiconductor substrate, wherein said configurable logic element selectively realizes a logic function from a logic library;
   at least a configurable computing element formed above said configurable logic element, wherein said configurable computing element comprises a three-dimensional vertical writable memory (3D-W$_V$) array for storing at least a portion of a look-up table (LUT) for a math function, wherein at least an input of said LUT comprises multiple bits;
   wherein said configurable computing array realizes a math function by programming said configurable logic element and said configurable computing element.

2. The configurable computing array according to claim 1, further comprising at least a configurable interconnect for selectively coupling said configurable computing element and said configurable logic element.

3. The configurable computing array according to claim 1, wherein said 3D-W$_V$ array overlaps at least a portion of said configurable logic element.

4. The configurable computing array according to claim 1, wherein said 3D-W$_V$ array comprises vertical transistors or vertical transistor-like devices.

5. The configurable computing array according to claim 4, wherein said 3D-W$_V$ array comprises 3D-NAND array.

6. The configurable computing array according to claim 1, wherein said 3D-W$_V$ array comprises vertical diodes or vertical diode-like devices.

7. A configurable computing array, comprising:
   a semiconductor substrate;
   at least a configurable interconnect formed on said semiconductor substrate, wherein said configurable interconnect selectively realizes an interconnect from an interconnect library;
   at least a configurable computing element formed above said configurable interconnect, wherein said configurable computing element comprises a three-dimensional vertical writable memory (3D-W$_V$) array for storing at least a portion of a look-up table (LUT) for a math function, wherein at least an input of said LUT comprises multiple bits;
   wherein said configurable computing array realizes a math function by programming said configurable interconnect and said configurable computing element.

8. The configurable computing array according to claim 7, further comprising at least a configurable logic element formed on said semiconductor substrate, wherein said configurable logic element selectively realizes a logic function from a logic library.

9. The configurable computing array according to claim 7, wherein said 3D-W$_V$ array overlaps at least a portion of said configurable interconnect.

10. The configurable computing array according to claim 7, wherein said 3D-W$_V$ array comprises vertical transistors or vertical transistor-like devices.

11. The configurable computing array according to claim 10, wherein said 3D-W$_V$ array comprises 3D-NAND array.

12. The configurable computing array according to claim 7, wherein said 3D-W$_V$ array comprises vertical diodes or vertical diode-like devices.

13. A configurable computing array, comprising:
   a semiconductor substrate;
   at least a configurable interconnect formed on said semiconductor substrate, wherein said configurable interconnect selectively realizes an interconnect from an interconnect library;
   at least a configurable logic element formed on said semiconductor substrate, wherein said configurable logic element selectively realizes a logic function from a logic library;
   at least a configurable computing element formed above said configurable interconnect, wherein said configurable computing element comprises a three-dimensional vertical writable memory (3D-W$_V$) array for storing at least a portion of a look-up table (LUT) for a math function, wherein at least an input of said LUT comprises multiple bits;
   wherein said configurable computing array realizes a math function by programming said configurable interconnect, said configurable logic element and said configurable computing element.

14. The configurable computing array according to claim 13, wherein said 3D-$W_V$ array overlaps at least a portion of said configurable interconnect.

15. The configurable computing array according to claim 13, wherein said 3D-$W_V$ array overlaps at least a portion of said configurable logic element.

16. The configurable computing array according to claim 13, wherein said 3D-$W_V$ array comprises vertical transistors or vertical transistor-like devices.

17. The configurable computing array according to claim 13, wherein said 3D-$W_V$ array comprises vertical diodes or diode-like devices.

18. The configurable computing array according to claim 13, wherein said 3D-$W_V$ array is an OTP (one-time-programmable) array.

19. The configurable computing array according to claim 13, wherein said 3D-$W_V$ array is an MTP (multiple-time-programmable) array.

20. The configurable computing array according to claim 13, further comprising at least one multiplier.

* * * * *